United States Patent [19]

Barker

[11] Patent Number: 4,933,639
[45] Date of Patent: Jun. 12, 1990

[54] AXIS TRANSLATOR FOR MAGNETIC RESONANCE IMAGING

[75] Inventor: Bruce R. Barker, Carrollton, Tex.

[73] Assignee: The Board of Regents, The University of Texas System, Austin, Tex.

[21] Appl. No.: 310,542

[22] Filed: Feb. 13, 1989

[51] Int. Cl.$^5$ ............................................. G01R 33/20
[52] U.S. Cl. ...................................... 324/309; 364/754
[58] Field of Search .................. 364/754, 728.01, 841, 364/606; 324/300, 307, 309, 311, 312, 313, 77 K; 128/653

[56] References Cited

U.S. PATENT DOCUMENTS

| | | | |
|---|---|---|---|
| 4,009,380 | 2/1977 | Booker | 324/77 K |
| 4,115,730 | 9/1978 | Mansfield | 324/0.5 A |
| 4,254,778 | 3/1981 | Clow et al. | 128/653 |
| 4,322,684 | 3/1982 | Hounsfield | 324/309 |
| 4,422,042 | 12/1983 | Sugimoto | 324/313 |
| 4,431,968 | 2/1984 | Edelstein et al. | 324/309 |
| 4,510,448 | 4/1985 | Riedl | 324/309 |
| 4,516,074 | 5/1985 | Sugimoto | 324/309 |
| 4,520,316 | 5/1985 | Hall et al. | 324/309 |
| 4,532,474 | 7/1985 | Edestein | 324/309 |
| 4,536,712 | 8/1985 | Iwaoka et al. | 324/309 |
| 4,545,384 | 10/1985 | Kawachi | 128/653 |
| 4,551,680 | 10/1985 | Macovski | 324/309 |
| 4,583,044 | 4/1986 | Case et al. | 324/309 |
| 4,585,992 | 4/1986 | Maudsley et al. | 324/309 |
| 4,599,565 | 7/1986 | Hoenninger III | 324/309 |
| 4,634,979 | 1/1987 | Riederer et al. | 324/309 |
| 4,667,300 | 5/1987 | Guilfoyle | 364/754 |
| 4,701,876 | 10/1987 | McCanny | 364/728.01 |
| 4,777,614 | 10/1988 | Ward | 364/754 |

OTHER PUBLICATIONS

Bernstein et al., Pulse sequence generated oblique magnetic resonance imaging: application to cardiac imaging, Medical Physics, vol. 13, No. 5, Sep/Oct. 1986, pp. 648-657.

Slone et al., Varying Gradient Angles and Offsets to Optimize Imaging Planes in MR, Rdiology 1986; 158:531-536.

Feiglin et al., Gated Cardiac Magnetic Resonance Structural Imaging: Optimization by Electronic Axial Rotation, Radiology 1985; 154:129-132.

Edelman et al., Oblique Planes of Section in MR Imaging, Radiology 1986; 159-807-810.

Kaul et al., Measurement of Normal Left Heart Dimensions Using Optimally Oriented MR Images, AJR 146:75-79, Jan. 1986.

Dinsmore et al., Magnetic Resonance Imaging of the Hear Using Image Planes Oriented to Cardiax Axes: Experience with 100 Cases, AJR 145:1177-1183, Dec. 1985.

Dinsmore et al., Magnetic Resonance Imaging of Heart: Positioning and Gradient Angle Selection for Optimal Imaging Planes, AJR 143:1135-1142, Dec. 1984.

Kulkarni et al., Techniques of Non-Orthoganol Magnetic Resonance Imaging and Its Clinical Application, Magnetic Resonance Imaging, vol. 5, pp. 39-49, 1987.

Zur et al., The effects of simultaneous pulsing in different gradient coils on the nuclear magnetic resonance imaging of oblique slices, Medical Physics, vol. 14, No. 2, Mar./Apr. 1987.

Primary Examiner—Michael J. Tokar
Attorney, Agent, or Firm—Arnold, White & Durkee

[57] ABSTRACT

An apparatus and a method to permit virtually any magnetic resonance imaging system to image slices of any orientation by converting its three-channel gradient current demand—a set of three time-varying voltages proportional to the instantaneous currents required in the x, y and z gradient coils—into that required for imaging the chosen plane or volume are provided. The method, which is referred to as axis translation, involves taking the input readout, phase-encoding and slice-selecting gradients from the system's host computer and rotating the orientation of these gradients through angles set by the system operator. This is accomplished using a 3×3 analogue matrix which outputs the appropriate imaging demand vector which is thereafter interpreted as current demand in the X, Y and Z coils of the magnetic resonance imaging system in the conventional manner.

2 Claims, 4 Drawing Sheets

AXIS TRANSLATOR FOR MAGNETIC RESONANCE IMAGING

BACKGROUND AND SUMMARY OF THE INVENTION

This invention relates generally to nuclear magnetic resonance imaging (MRI) techniques. More particularly, the present invention relates to methods of obtaining MRI images at selectable oblique angles.

Nuclear magnetic resonance imaging techniques are becoming increasingly popular for obtaining images of a patient's body tissues. MRI is based on the ability to induce and monitor resonance of the magnetic moment of selected nuclei in the presence of magnetic fields. Protons (hydrogen nuclei), for example, normally spin about axes that are oriented randomly. Subjected to a strong, uniform magnetic field, the axes substantially align with the magnetic field but retain a certain precession or "wobble" at a frequency that is a function of the magnetic field strength. If a magnetic field gradient that varies at all points in the body under observation is superimposed on the uniform field, then each nucleus at each point in the body will also have a unique spin frequency.

A radio frequency (rf) pulse at a selected resonance frequency may then be applied, causing selected excitation of the protons. After the rf pulse ends, the protons tend to realign with the magnetic field with a resultant release of this excitation energy. This energy is detected and related to the density of protons (and thus of water).

The sequence, phase and duration of the rf and field gradient pulses are directed by the MRI system's host computer. Nuclei other than those of hydrogen may also be observed by appropriate selection of magnetic field and rf pulse. Useful information may also be obtained from variations in spin-spin and spin-lattice relaxation times in various tissues. The NMR signals thus obtained are digitized and Fourier transformed to obtain the projection data of the spin density distribution of the specific atomic nuclei in the various directions.

Certain organs are best viewed from certain angles. For example, nuclear medicine radiologists and angiographers have long preferred to image the heart in a left anterior oblique (LAO) projection—that is, as seen along a line approximately 45° to the patient's left of the anterior direction. X-ray computed tomography (CT) employs a variety of standard oblique sections in brain, spinal and heart imaging within the limited range of gantry rotation.

Magnetic resonance imaging offers the possibility of tomographic (slice) imaging in any plane. MRI radiologists ave expressed special interest in cardiac MRI along the anatomical axes of the heart. As noted in Dinsmore et al., AJR 143, pp. 135-42, December, 1984, images of the heart in transverse, sagittal and coronal thorasic planes are easy to obtain and, in the case of the transverse plane, are comparable to computed tomographic images. However, images of the heart in planes orthogonal to the chest have important disadvantages. First, major cardiac axes, notably those of the left ventrical and septa, do not lie in planes orthogonal to the thorax and are not optimally displayed by these views. Second, orthogonal images are not strictly comparable from patient to patient, because they do not take into account variability in the orientation of the heart in the chest due to such factors as body habitus and the position of the diaphragm. As a result of these technical deficiencies, conventional orthogonal images are not well adapted to the study of clinical problems that require accurate cardiac measurements, such as calculation of ventricular volume and ejection fraction. Since the orthogonal planes are oblique to much of the left ventricular myocardium, a number of errors may occur. Wall thickness tends to be falsely increased and errors are introduced in the evaluation of wall motion. In addition, because of the partial-volume effect, there is potential for error in evaluation of myocardial tissue signal in both the epicardial and subendocardial areas with images oblique or tangential to the muscle wall. This effect will also make the myocardium appear thicker than it is.

Solutions to the problem of providing oblique imaging have to date been implemented in limited ways in sequence software on several MRI systems. Another implemented technique for oblique imaging includes actual rotation of the patient. Dinsmore, et al., Magnetic Resonance Imaging of the Heart Using Image Planes Oriented to Cardiac Axes: Experience with 100 Cases, AJR: 145, p. 1177, December 1985.

There are some basic problems with the software approach. Some MRI systems do not have a computer architecture that would permit this degree of flexibility in sequence software. In all cases, the assumptions regarding the three physical gradient channels would have to be programmed into the software. If the channels are not precisely equivalent, the assumptions might have to include data based on painstaking site-specific measurements. Doing the axis translation process right, automating for each combination of scan angles what is normally an empirical gradient pulse calibration process, would then be so complicated that it would probably be impractical. If the channels' differences were ignored, the result of axis translation would be uncalibrated gradient performance, namely loss of signal-to-noise ratio, incorrect aspect ratios, and a variety of artifacts.

Another technique for providing oblique images comprises reformatting stacks of conventionally acquired slices. This approach suffers from loss of field of view, limited rotational range, and the need for complex interpolation schemes—which may artificially smooth the image—to minimize loss of in-plane resolution due to the thickness of acquired slices and to gaps between slices.

It would therefore be advantageous to provide a method and apparatus for NMR oblique imaging that is transparent to the system software. It would also be advantageous for such a system to provide oblique images at any angle with a patient aligned along the orthogonal axes of the system. Another advantage of such a system would provide direct imaging and avoid reformatting conventionally acquired imaging data.

The present invention overcomes the above-noted and other drawbacks of the prior art by providing a method and apparatus for providing an oblique image slice in a magnetic resonance imaging system. The apparatus and method are adaptable to virtually any existing MRI system without the need to reprogram the system's host computer.

BRIEF DESCRIPTION OF THE DRAWINGS

The above-noted and other aspects of the present invention will become more apparent from a description of the preferred embodiment when read in conjunction with the accompanying drawings.

The drawings illustrate the preferred embodiment of the invention, wherein like members bear like reference numerals and wherein.

DESCRIPTION OF A PREFERRED EMBODIMENT

Figure 1:
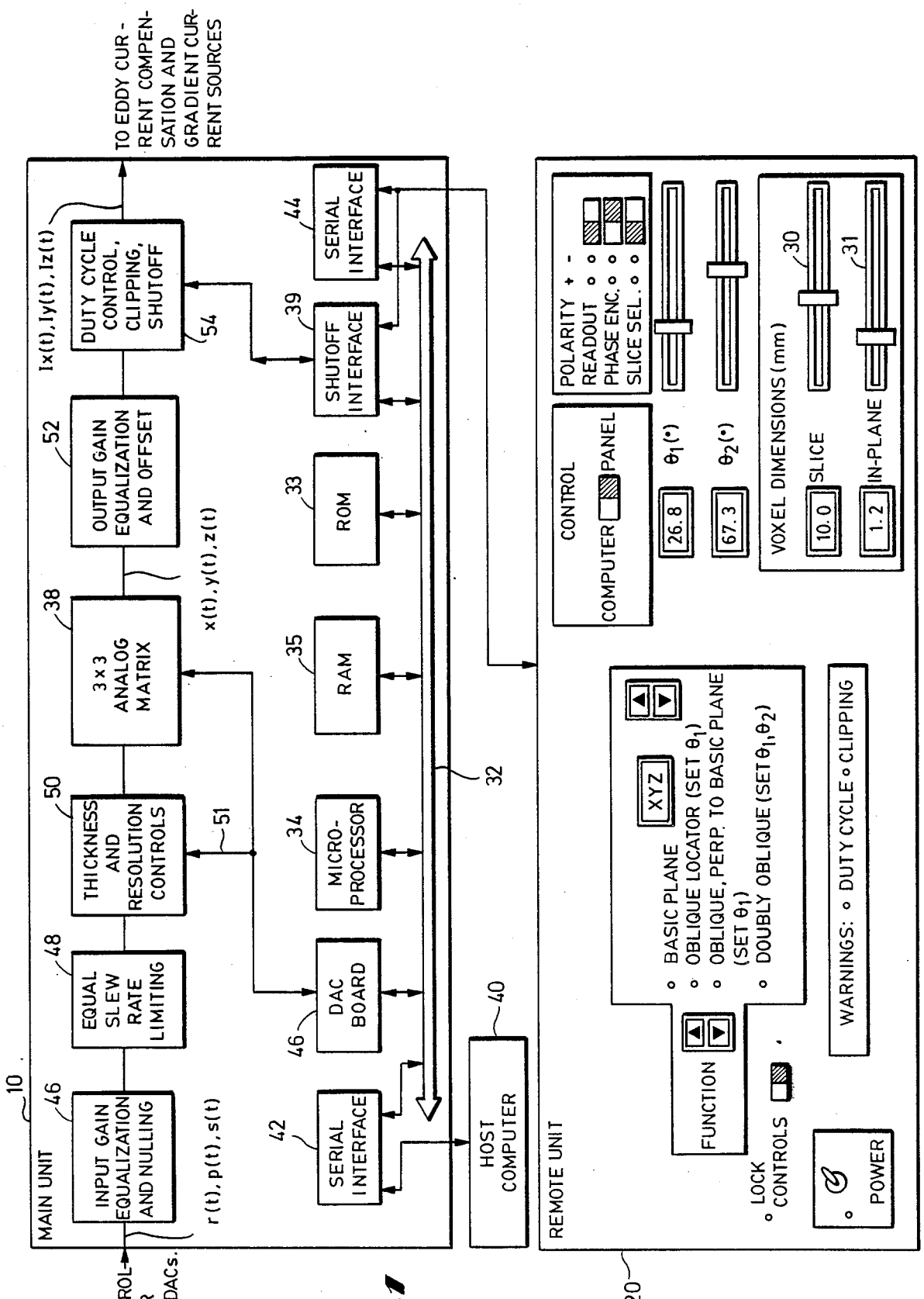
FIG. 1 is a block diagram of the apparatus of the present invention installed in a magnetic resonance imaging system.

The three basis vectors that define a magnetic resonance imaging plane or space may be given by three orthogonal gradient directions. There must be three gradient dimensions because MRI is inherently volumetric, with each dimension of spatial information derived from one gradient component. In the most common MRI technique, two-dimensional Fourier transform imaging, the directions are generally referred to as readout(r), phase-encoding(p), and slice-selecting(s) directions. For greater generality, the gradient functions or dimensions could be called primary, secondary and tertiary. All that is actually assumed is that the third gradient is perpendicular to the image plane and that the other two gradients have known orientations and polarities in the image plane. One could, for example, perform projection-reconstruction imaging by connecting the projection cosine signal to the readout input and the projection sine demand to the phase-encoding input. One could do volumetric imaging by connecting the secondary phase-encoding demand to the slice-selecting input.

Mathematical Development of Rotations

The mathematical theory of rotations that follows is a variant of Eulerian angle rotation applied to a procedure to determine the rotation angles from magnetic resonance images. Bold-face lower case letters represent vectors, plain lower case represent scalars, and bold-face capitals represent matrices or linear transformations.

Ideal imaging gradients are spatially uniform over the imaging volume, so that a single gradient $g(t) = [r(t) \; p(t) \; s(t)]$ exists at a time, where $r(t)$, $p(t)$, and $s(t)$ are the components in the readout, phase-encoding, and slice-selecting directions. These components are generated separately in MRI systems as three demand voltages from the control computer's digital-to-analog converters (DACs). The x, y, and z channels of a pulsed-gradient power supply deliver currents proportional to those voltages. For example, the control computer may issue the demand pulses where the readout direction is x (i.e., $r(t) = g_x(t)$), the phase-encoding direction is y ($p(t) = g_y(t)$), and the slice-selecting direction is z ($s(t) = g_z(t)$). This mode can be abbreviated as "xyz imaging," which is more precise than "transverse", since the latter specifies only the slice-selecting direction.

Three cartesian coordinate systems, or sets of axes, will be used: the fixed system of xyz transverse imaging; the system of the basic locator plane, one of the six possible transverse, sagittal and coronal planes; and the system of the oblique locator plane. Other planes will be used, but they can be defined within these systems. As used here, a "plane" is a complete display orientation in which the three functional axes are given. Hence, the expressions "plane", "imaging vector", "gradient vector" and "imaging axis system" become equivalent.

The operation that converts a vector's coordinate representation in one system to that of another system is an example of a kind of linear transformation that is referred to as a transformation. The same mathematical operation rotates the vector in the opposite direction by the same angles (and may likewise invert one component) within the same coordinate system. Hence, the inverse transformation does to a vector within one system what the original transformation does to the system. A transformation may be represented mathematically as a hermetian matrix, a matrix that does not change the length of a vector and whose inverse is its transpose. However, a matrix that defines a transformation in one coordinate system will not do the same in another system.

As used herein, the fixed axis system of xyz transverse imaging is designated by the subscript "a" applied to vectors defined in that system. That is, $v_a = (v_x \; v_y \; v_z)$. Since these components correspond to the three demand inputs that an XYZ pulsed-gradient power supply must have, this a-space representation of any imaging vector must be found. Also, the subscript "b" stands for the basic locator system; hence, if $w_b(n) = [w_r(n) \; w_p(n) \; w_s(n)]$ is an imaging vector, $w_r(n)$ is the gradient in whatever direction the chosen basic locator uses for readout. The vector space b in which it is defined is a function of the choice of the six possible basic locator permutations, n:

| n | Locator r,p,s | n | Locator r,p,s |
|---|---|---|---|
| 1 | xyz | −1 | xzy |
| 2 | yzx | −2 | yxz |
| 3 | zxy | −3 | zyx |

No values of n are defined for imaging with gradient functions along -x, -y, and -z, because the 48 basic locators that would result are unnecessary. (They can, however, be obtained by reversing polarity switches or through software manipulations.)

As used herein, the subscript "c" stands for the oblique locator system, which is a function of $\theta_1$ and of the basic locator n from whose image that angle was derived. Hence, if $u_c(n, \theta_1) = [u_1 \; u_2 \; u_3]$ is an imaging vector, $u_1(n, \theta_1)$ is the gradient in the direction the oblique locator uses for readout, and so forth.

Let $a_a$ be the xyz transverse imaging vector, representing the input from the control computer DAC to the axis translator. Let $b_a(n)$, $c_a(n, \theta_1)$, and $d_a(n, \theta_1, \theta_2)$ be the imaging vectors for the basic locator, the oblique locator, and doubly rotated imaging, respectively. The transformations for $a_a$ via $b_a$ and $c_a$ to $d_a$ are as shown along the top row in FIG. 2.

Finding matrices $C_n(\theta_1)$, other than $C_1$, and $F_n(\theta_1, \theta_2)$ requires coordinate system transformations from a to b coordinates and back. Let $M_0(n)$ transform any a vector into its b representation. Then $$b_b(n) = M_0(n) \, b_a(n).$$

But $b_b$ is an imaging vector in its "own" axis system, so it is just [r p s], or $a_a$. Likewise, $$c_c = b_b = a_a = [r \, p \, s].$$

Since $M_0(n)b_a(n) = M_0(n)B_n a_a = a_a$, it follows that $$M_0(n) = B_n^{-1}$$

i.e., $B_n^{-1}$ transforms *any* vector from a to b coordinates. Then, $B_n$ transforms any vector from b to a representation.

If the transformation from $b_b$ to $c_b(\theta_1)$ were, for the time being, $M_1(\theta_1)$, $$c_a(n, \theta_1) = C_n(\theta_1) b_a(n)$$

$$= B_n M_1(\theta_1) B_n^{-1} b_a(n), \text{ so that}$$

$$C_n(\theta_1) = B_n M_1(\theta_1) B_n^{-1}.$$

Figure 2:
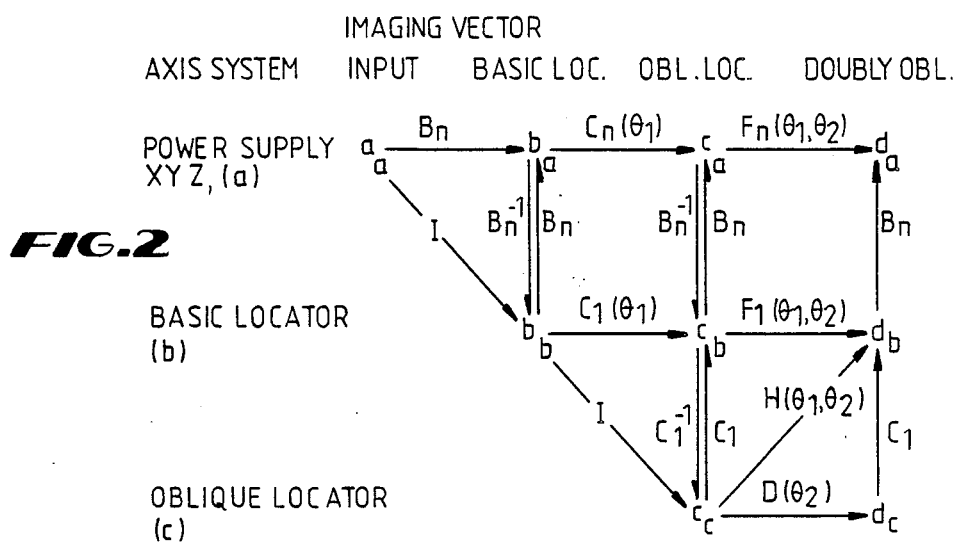
FIG. 2 is a diagram demonstrating linear transformations of input vectors into imaging vectors provided by the invention.

But, $B_1 = I$, the identity matrix, so
$C_1(\theta_1) = M_1(\theta_1)$, as shown in the second row of FIG. 2, where vectors are in basic locator coordinates.

The oblique locator may be derived from the basic locator by finding the angle $\theta_1$ between the oblique locator's slice-selecting axis and the readout axis of the basic locator in the latter's image and setting the phase-ecoding axis of the oblique locator to the slice-selecting axis of the basic locator. The vector transformation that converts the basic locator into the oblique locator in basic locator coordinates may be denoted by a matrix $C_1(\theta_1)$, whose elements are cosines of the angles between the three component vectors of b and $c_b$:

$$C_1(\theta_1) = \begin{matrix} \sin\theta_1 & 0 & \cos\theta_1 \\ -\cos\theta_1 & 0 & \sin\theta_1 \\ 0 & -1 & 0 \end{matrix}$$

By similar approaches $F_1$, $F_n$, D, and H (FIG. 2) may be found. Then using the relations from FIG. 2, the basic locator, oblique locator and doubly rotated imaging vectors may be found in xyz coordinates:

$$b_a = B_n \, a_a,$$

$$c_a = B_n \, C_1(\theta_1) \, a_a, \text{ and}$$

$$d_a = B_n \, H(\theta_1, \theta_2) a_a,$$

where $H(\theta_1, \theta_2) = C_1(\theta_1) D(\theta_2)$.

$$\text{and } D = \begin{matrix} 0 & \cos\theta_2 & -\sin\theta_2 \\ 0 & \sin\theta_2 & \cos\theta_2 \\ 1 & 0 & 0 \end{matrix}$$

Let the e imaging vector designate singly rotated imaging, that is, imaging in a plane perpendicular to the basic and oblique locators, containing the anatomical line chosen in the basic locator. Here, the e readout gradient is the b readout gradient rotated by $\theta_1$ about the b slice-selecting axis, the e phase-encoding gradient is opposite the b slice-selecting gradient, and the e slice-selecting gradient is the b phase-encoding gradient rotated by $\theta_1$ about the b slice-selecting axis. The transformation $E_1(\theta_1)$ from $b_b$ to $e_b$ (FIG. 4) may be found by inspection:

$$E_1(\theta_1) = \begin{matrix} \cos\theta_1 & 0 & -\sin\theta_1 \\ \sin\theta_1 & 0 & \cos\theta_1 \\ 0 & -1 & 0 \end{matrix}$$

Figure 4:
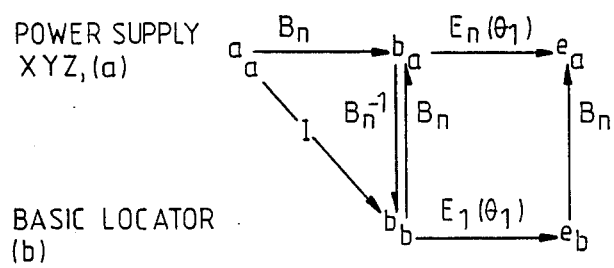
FIG. 4 is a diagram demonstrating transformations and intermediates for producing a singly rotated imaging vector.

FIG. 4 shows that $$e_a(n, \theta_1) = B_n E_1(\theta_1) a_a.$$

The axis translator's microcomputer calculates the nine elements of $B_n$, $B_n C_1(\theta_1)$, $B_n H(\theta_1, \theta_2)$, or $B_n E_1(\theta_1)$ for basic locator, oblique locator, doubly rotated or singly rotated imaging, respectively, and sends them to the DACs. These nine voltages, together with the three input-vector voltages, form the analog matrix M (FIG. 3), which produces the appropriate imaging current demand vector $b_a$, $c_a$, $d_a$, or $e_a$.

Any of the locators may be omitted, the angles determined from them being entered as a priori estimates.

A third rotation may be performed within the plane. This rotation affects the orientation of the readout and phase encoding axes within the plane and therefore the orientation of the display. No additional locators would be needed to find this rotation angle, $\theta 3$. To perform this rotation, the imaging vector is multiplied by:

$$J = \begin{matrix} \cos\theta 3 & \sin\theta 3 & 0 \\ -\sin\theta 3 & \cos\theta 3 & 0 \\ 0 & 0 & 1 \end{matrix}$$

Apparatus of the Present Invention

FIG. 1 depicts a preferred embodiment for carrying out axis translation. This configuration consists primarily of a main unit 10 and a remote unit 20. The remote unit 20 comprises the basic controls and indications to permit the MRI operator to control and monitor the axes of imaging of the MRI system. It also permits the operator to select voxel dimensions, both slice thickness and in-plane dimension. The remote unit 20 consists of a control panel and an eight bit microprocessor with associated scratchpad RAM, EPROM, Standard Serial Interface and logic that polls voltages on control panel pots by means of an analog multiplexer and converts them to digital form via an eight bit analog-to-digital converter (ADC). The microprocessor also enters this data and switch settings into the packet data structure in RAM, and sends the packet to the main unit over an RS-232C serial link. In a preferred embodiment, the voxel dimension controls are adjusted by a set of pots 30 and 31. For any given sequence, the user may adjust slice thickness or in-plane voxel size ("resolution") by turning the pots 30, 31 on the remote unit 20, calibration having been performed with these pots set at 1.000. For example, a sequence could have a nominal slice thickness of 1.0 cm and a nominal resolution of 1.0 mm, but 2.5 mm×2.5 mm×2.0 cm voxels may be had by turning the pots to higher number/lower gain. Recalibration would not be necessary as long as the entire device is linear. These functions may also be programmed into the MRI system's host computer 40 of FIG. 1.

In a preferred embodiment, the digital circuitry of the main unit consists of a microprocessor 34, random access memory (RAM) 35, read only memroy (ROM) 33, a serial interface 42 to the host computer, a serial interface 44 to the remote unit, a DAC board 36, and an interrupt/shutoff interface 39. These circuits communicate through connection to a standard 8-bit microcomputer bus 32, such as the S-100 bus, VME bus or STD bus.

An input gain equalization and nulling circuit 46 is provided. Circuit 46 comprises three operational-amplifier-based differential amplifier circuits (one for each of readout, phase-encoding and slice selecting directions), with trimpots for gain and offset control.

Figure 5:
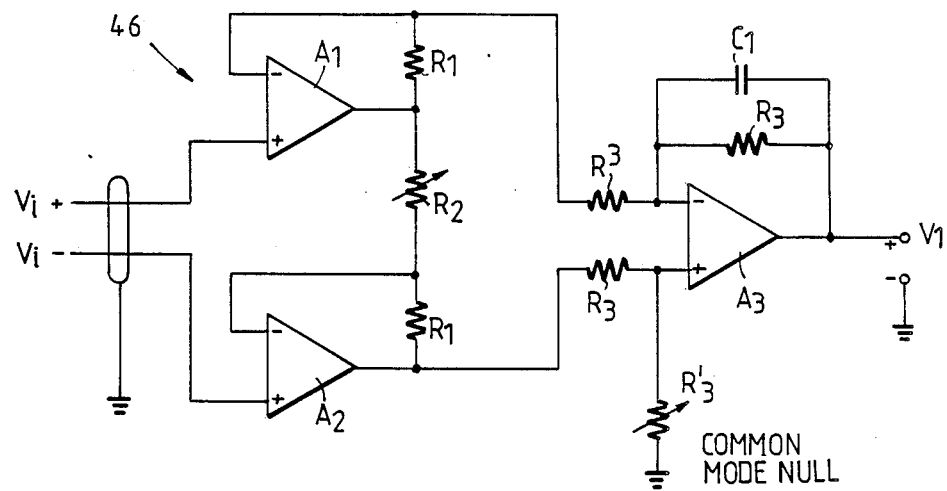
FIG. 5 is a schematic diagram of an input gain equalization and nulling circuit.

FIG. 5 depicts such an input gain equalization and nulling circuit 46. A circuit 46 is provided for each of the r, p, and s inputs. A pair of op amps $A_1$ and $A_2$ receive at their positive inputs the positive input voltage $V_{1+}$ and the negative input voltage $V_{i-}$, respectively. FIG. 5 further shows the known relationship of a pair of resistors $R_1$ and an adjustable resistor $R_2$ in determining overall difference more gain of the circuit 46. An adjustable resistor or trimpot $R_3'$ provides a common-mode null adjustment.

An equal slew rate limiting circuit 48 is provided. Circuit 48 comprises three operational amplifier circuits (one for each of the readout, phase-encoding and slice select directions). Whenever the input voltage on a channel (r, p, or s) exceeds that of an output shunt capacitor (the circuit's output voltage), the op amp goes into positive saturation and charges the capacitor through a precision resistor or trimpot at a fixed positive rate. Whenever the input voltage falls below the output voltage, the op amp goes into negative saturation and discharges the capacitor at the same fixed rate. When the input voltage and output voltage are identical, the circuit 48 remains stable as a unity gain buffer. Hence, a step in the input results in a ramp of the output until the output voltage equals the input voltage, whereupon it levels off.

Figure 6:
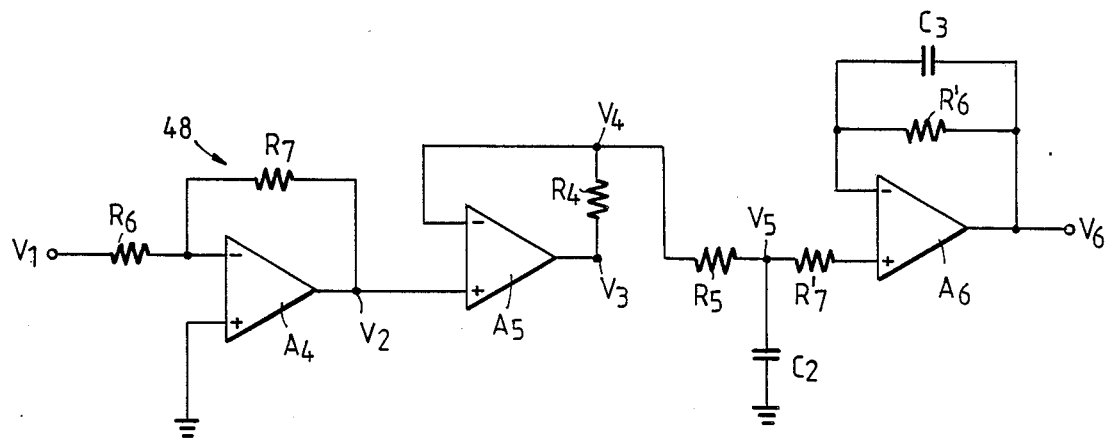
FIG. 6 is a schematic diagram of a slew rate limiting circuit.
Figure 7:
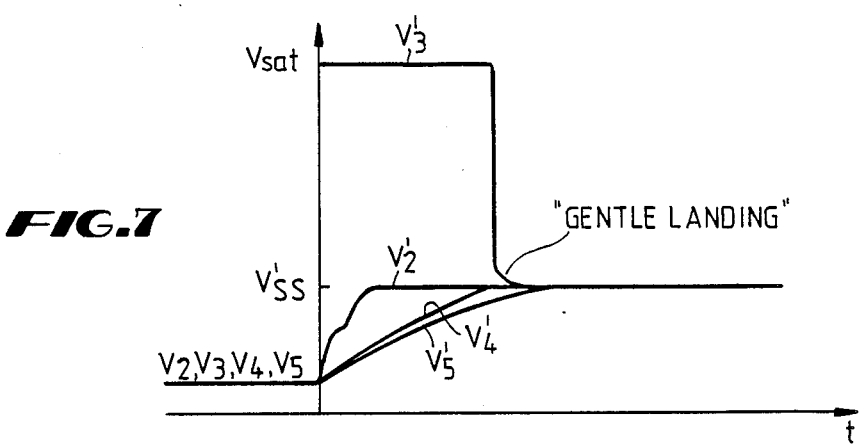
FIG. 7 depicts time varying voltages at various nodes in the slew rate limited circuit.

FIG. 6 depicts such a slew rate limiting circuit 48. A first operational amplifier $A_4$ and its associated resistors $R_6$ and $R_7$ provide a first stage of attenuation. An operational amplifier $A_6$ and its associated resistors $R_6'$ and $R_7'$ provide a final stage of amplification by the same amount. This way the steady state voltages at $V_1$ and $V_6$ are equal, as are $V^2$ and $V^5$. In between the attenuation and amplification stages, an operational amplifier $A_5$ provides a "Filter" action for positive and negative going pulses. A series of nodes $V_2$, $V_3$, $V_4$, and $V_5$ are marked for ease of explanation. As used here, $V_2$ describes the node $V_2$ or the voltage on that node, etc. $V_2'$ refers to the time varying voltage at node $V^2$ after a voltage change at the input node $V_1$. FIG. 7 depicts the time varying voltages at these nodes for a positive going pulse.

In FIG. 6, preferred element values are:

$$\frac{R_7}{R_6} = \frac{R_7'}{R_6'}$$

$$R_5 \simeq \frac{R_4}{10}$$

-continued $$C_3 \simeq 5 \text{ pf.}$$

At steady state, the voltages $V_2$, $V_3$, $V_4$, and $V_5$ are equal. For a step rise in $V_1$, the voltage out of the circuit 46, $V_2'$ rises rapidly and the op amp $A_5$ saturates immediately. A pair of resistors $R_4$ and $R_5$ conduct current to ground through a capacitor $C_2$, charging the capacitor $C_2$ at a time constant $\tau=(R_4+R_5) C_2$. When the voltage $V_4'$ equals the voltage $V_2'$, the op amp goes into linear operation for a "gentle landing" at $V_{ss}'$. At each point in time, $V_6$ is the amplified voltage of $V_5'$, determined by the ratio of resistors $R_6'$ and $R_7'$.

Also, $$\frac{dV_5'}{dt} = \frac{(V_{sat} - V_5)\exp(-t/\tau)}{\tau}$$

$$\simeq \frac{V_{sat}}{\tau}, \text{ for } V_5 << V_{sat} \text{ and } t << \tau$$

A thickness and resolution controls circuit 50 is provided. Controls circuit 50 is actually three control circuits (one for each of the readout, phase-encoding and slice-selecting directions). Each circuit has an associated 8-bit latch, in a preferred embodiment an ALS573, connected between the DAC board 36 and its digital input. A control line 51 from the DAC board 36 makes the latch transparent in setup mode and latches it in SCAN mode. The digital input, calculated by the CPU, is inversely proportional to the appropriate divisor. The divisors are so named because they divide gradient determining voltages; in fact, they multiply voxel dimensions, which are inversely proportional to the gradient determining voltages. For example, varying the divisors from 1 to 10 provides a variation in the gains of the thickness and resolution control circuits of 1 to 0.1.

The DAC board 36 comprises 12 DACs, preferrably of 10 bit resolution and of precision and linearity better than one least-significant-bit.

Figure 3:
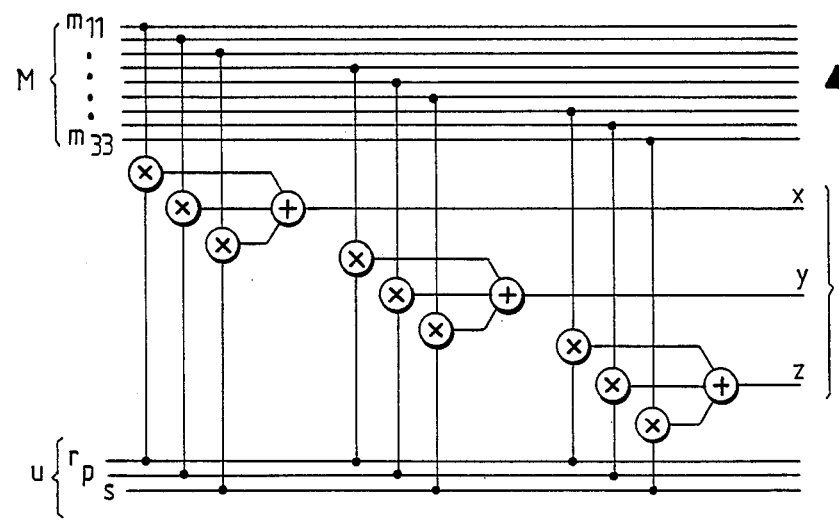
FIG. 3 is a schematic diagram of an analog 3X3 matrix-vector multiplier that implements the present invention.

The analog matrix 38 comprises an array of nine two-input analog multipliers and three three-input analog summing circuits connected as depicted in FIG. 3.

An output gain equalization and offset circuit 52 provides a stable unity gain buffer. It functions in a manner similar to that of the input gain equalization and nulling circuit 46, depicted in FIG. 5.

A control circuit 54 comprises three major portions: duty cycle control, clipping circuits and a shutoff. The duty cycle control comprises three (x, y, z) analog periodic integrators of long (several seconds) time constant RC filters branching off and well buffered from the main signal flow. The filtered signal voltage is compared in two Schmitt triggers to symmetric thresholds defined by dial pot R10. The time constant is variable by means of a dial pot in each filter.

Figure 8:
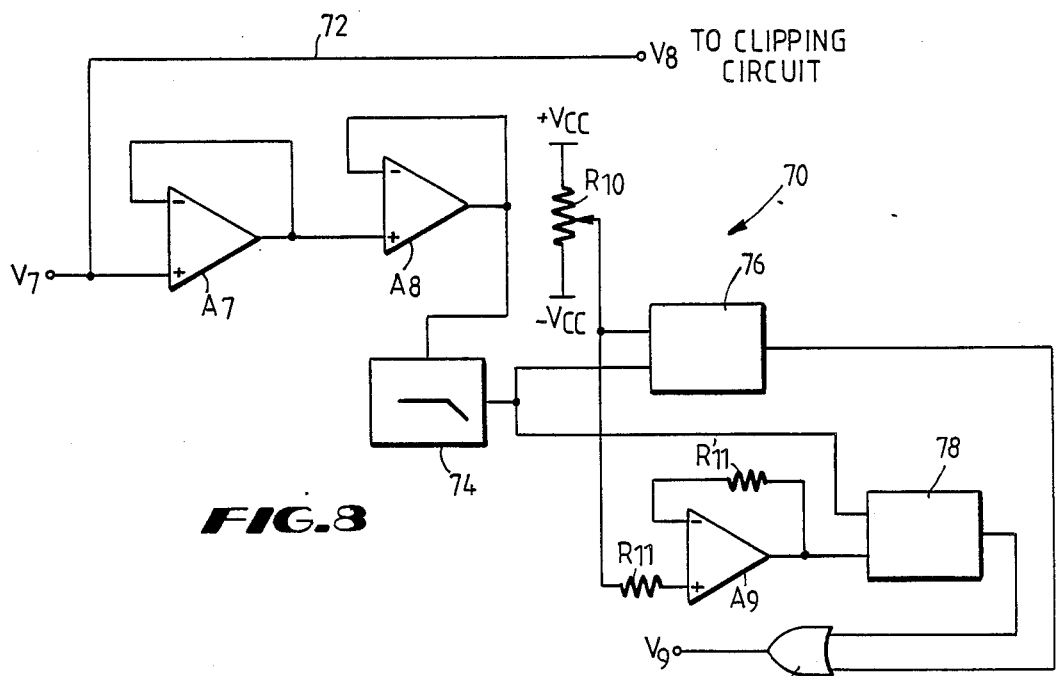
FIG. 8 is a schematic diagram of a duty cycle control circuit.

FIG. 8 depicts a preferred embodiment of a duty cycle control circuit 70. Input to the duty cycle control circuit 70 is provided by the output gain equalization and offset circuit 52 and the input to the circuit 70 is designated in FIG. 8 as a node $V_7$. Under normal operation, a conductor 72 passes this input along to the clipping via a node $V_8$. A pair of op amps $A_7$ and $A_8$ buffer the input at the node $V_7$ from the remainder of the duty cycle control circuit 70. A low-pass filter 74, such as a −40 db/decade filter, smooths the signal to near-DC. A comparator 76, such as a Schmitt trigger, compares the filtered signal to a set point set by adjusting a trimpot $R_{10}$. The comparator 76 provides duty cycle control for positive going waveforms. An op amp $A_9$ and its associated equal-value resistors $R_{11}$ and $R_{11}'$ invert the setpoint that is set by the trimpot $R_{10}$. Thus, the filtered signal is also compared to a negative setpoint for negative going waveforms by a comparator 78. If the filtered signal is further from zero than either the positive or negative setpoint, the comparator 76 or the comparator 78, respectively, develops a voltage pulse to an OR gate 80. The OR gate 80 passes this pulse as an interrupt signal to the intterupt/shutoff interface in the microcomputer 34 via a node designated in FIG. 8 as $V_9$.

The second major part of the control circuit 54 is a clipping circuit. The clipping circuit comprises three (x, y, z) unity-gain buffers, each of which restricts its output to a range determined by dial pot settings and causes a Schmitt trigger to emit a TTL pulse when clipping occurs. Random logic, possibly in combination with a programmable interrupt controller, combines the TTL warning signals into (a) a single CPU interrupt indicating any warning(s), (b) a latched bit, readable by the CPU in the microcomputer 34, indicating any duty cycle warning, (c) a latched bit, readable by the CPU, indicating any clipping, and (d) three latched bits, readable by the CPU, indicating warning on X, Y, and Z, respectively.

Figure 9:
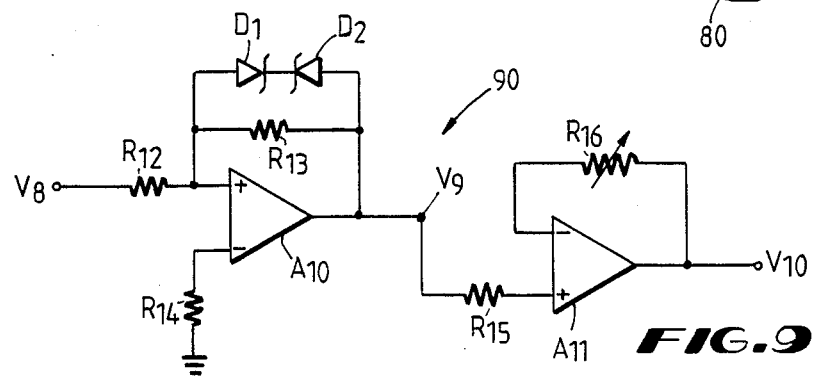
FIG. 9 is a schematic diagram of a clipping circuit.

FIG. 9 depicts a clipping circuit 90. An op amp $A_{10}$ and its associated resistors $R_{12}$ and $R_{13}$ and Zener diodes $D_1$ and $D_2$ provide signal clipping. An op amp $A_{11}$ and its associated resistor $R_{15}$ and trimpot $R_{16}$ comprise a scaling amplifier. For the clipping circuit of FIG. 9:

$$\frac{V_{10}}{V_8} = \frac{R_{16}R_{13}}{R_{15}R_{12}}, \text{ if } |V_8| < \frac{R_{12}}{R_{13}}(V_z + 0.7v)$$

$$\frac{V_{10}}{V_8} = \frac{V_8}{|V_8|} \frac{R_{16}}{R_{15}}(V_z + 0.v7), \text{ if } |V_8| > \frac{R_{12}}{R_{13}}(V_z + 0.7v)$$

where $V_z$ refers to the Zener breakdown voltage. That is, $V_{10}$ is clipped at $$-\frac{R_{16}}{R_{15}}(V_z + 0.7 V)$$

The third major part of the control circuit 54 is a shutoff, which comprises three (x, y, z) electromechanical relays in the main signal path, controlled by the CPU. Their normal (unpowered) positions are connected to ground.

The chosen basic locator n, the axis translation type (basic or oblique locator, etc.), and the translation angle(s) $\theta_1$, $\theta_2$ in the form of appropriate digital (computer) signals are interfaced to a microcomputer 34 in the main unit 10. There, the microcomputer 34 simply calculates the matrix values ($m_{11}$ through $m_{33}$). These are conventional geometric calculations. These nine values are converted to analog form in a digital-to-analog converter 36 and input into an analog matrix 38.

Referring now to FIG. 3, matrix values $m_{11}$ through $m_{33}$ are multiplied by their respective readout, phase-encoding and slice-selecting time varying voltages from the digital-to-analog converters of the MRI system's control computer. As shown in FIG. 3, the resultant products are summed to yield the time varying x,y,z signals which determine the demand currents in the three gradient dimensions.

For gradients to be rotatable, there are two hardware requirements. First, the three channels must be equivalent in gain (gradient produced ÷ demand input) and in dynamic response (rise and fall times) so that they may be interchanged. Second, all channels must respond linearly with respect to demand input so that a gradient function can be broken up into components in a predictable way. The first requirement may be met by compensating the analog matrix outputs for differences in gain among the three gradient current sources. The second requirement means that the axis translator must be highly linear and that slew rate limiting must occur before any axis translations, since slew rate limiting is a nonlinear process.

The apparatus of the present invention must be calibrated for the MRI system in which it is installed. Input gains are scaled to the operating range and any offsets are nulled out in a conventional manner. This represents the input stage 46 of the main unit 10 as shown in FIG. 1. Slew rate limiting of the three inputs is set equally to such a rate that the power supply channel requiring the slowest demand switching (because of coil inductance, etc.) is prevented from voltage clipping.

On the output out of the analog matrix, gains are set to compensate for the channels' differences in the ratio of gradient to current and to avoid overdriving with maximum demand. Any offsets are nulled out. The duty cycle control circuit is calibrated for the maximum safe duty cycle of the power supply channels.

The sequences to run in the control computer must always be of the same nominal polarity, such as xyz transverse. No imaging sequence should be allowed to call at any moment for a gradient magnitude $G = \sqrt{(r^2+p^2=s^2)}$ exceeding the rating of any current source channel, because certain transformations can force one channel to supply the entire gradient. This is a consideration at times when more than one of (r, p, s) are pulsed. The alternative to reprogramming of pulse sequences is to reduce the output gains by $\sqrt{3}$. This has the disadvantage of increasing minimum voxel dimensions by $\sqrt{3}$, which acts against the widespread desire among users for thin slices.

In a preferred embodiment of the present invention, the remote unit or the host computer communicates with the main unit over an RS-232C serial link using the following data packet:

| Element | Source | Size | Encoding |
|---|---|---|---|
| Header | rem./main | 2 B | unique binary sequence |
| Control Bits In: | remote | 1 B | boolean |
| Setup/Scan | | 1 b | 0=Scan, 1=Setup binary |
| Plane | | 3 b | 0=Bypass, 1=Basic, 2=Obl.Loc. etc. |
| R polarity | | 1 b | 0=+, 1=− |
| P polarity | | 1 b | 0=+, 1=− |
| S polarity | | 1 b | 0=+, 1=− |
| Control Bits Out: | main unit | 1 B | boolean |
| Ready | | 1 b | 1=Ready |
| Scanning | | 1 b | 1=Scan running |
| Duty Cycle Warn | | 1 b | 1=Duty Cycle warning |
| Clipping Warn | | 1 b | 1=Warning of clipping |
| X | | 1 b | 1=Warning on X |

-continued

| Element | Source | Size | Encoding |
|---|---|---|---|
| Y | | 1 b | channel 1=Warning on X |
| Z | | 1 b | channel 1=Warning on X |
| N (basic plane) | remote | 1 B | channel character (ASCII) "1"=XYZ, "2"=YZX, "3"=ZXY, "4"=XZY, "5"=YXZ, "6"=ZYX |
| THETA1 | remote | 1 B | 8 bit unsigned integer $\theta1=1.4063$ deg *THETA1 |
| THETA2 | remote | 1 B | 8 bit unsigned integer $\theta2=1.4063$ deg *THETA2 |
| R_DIVisor | remote | 1 B | 8 bit unsigned integer |
| P_DIVisor | remote | 1 B | 8 bit unsigned integer |
| S_DIVisor | remote | 1 B | 8 bit unsigned integer |
| Trailer | rem/main | 1 B | unique binary sequence |

Use of the Apparatus

In using the apparatus of the present invention, the user first performs a scan in a basic locator plane. He determines a line in the resulting image that is to represent the intersection of the final imaging plane or center slice with the image he is viewing. Most commercial magnetic resonance imaging systems have display software that permits the line to be drawn as an overlay to the image. Using either a protractor or appropriate display software, he measures an angle, $\theta1$, between the chosen line and the readout axis. After entering $\theta1$ into the axis translator, he selects singly rotated imaging or an oblique locator. In singly rotated imaging, any single slice or multi-slice rotatable imaging sequence may be performed. Its planes are oriented parallel to the chosen line, so that the line lies within one slice, and perpendicular to the basic locator plane. The purpose of an oblique locator, on the other hand, is to find a second rotation angle $\theta2$ in order that doubly rotated imaging, whose planes may be in any orientation, may be performed. The oblique locator lies perpendicular to the line chosen in the basic locator. $\theta2$ is the angle a line chosen in the oblique locator makes with the horizontal (readout) axis of its image.

For example, to image within or parallel to the plane of the septum of the heart, one first performs a basic locator in any orientation. Drawing a line along the septum in the basic locator image, one measures and enters the angle $\theta1$ that the septal line makes with the horizontal axis. Next, an oblique locator is performed. Again, one draws a line along the septum and measures and enters its angle, $\theta2$, to the horizontal. Any number of doubly oblique scans of any type may then be performed. Their planes would lie parallel to the septum.

The principles, preferred embodiments and modes of operation of the present invention have been described in the foregoing specification. The invention is not to be construed as limited to the particular forms disclosed, since these are regarded as illustrative rather than restrictive. Moreover, variations and changes may be made by those skilled in the art without departing from the spirit of the invention.

What is claimed is:

1. A magnetic resonance imaging axis translator comprising:
    (a) input means comprising readout, phase-encoding and slice-selecting voltage channels;
    (b) a three-by-three analogue matrix vector multiplier having matrix elements for operating upon signals on said voltage channels to effect axis translation;
    (c) means for varying said matrix elements to vary the axis translation of signals on said voltage channels; and
    (d) output means from said vector multiplier to provide signals which develop current demands in the gradient coils of a magnetic resonance imaging system.

2. A method of axis translation in a magnetic resonance imaging system comprising:
    performing a series of locator scans from whose images rotation angles may be measured directly;
    receiving input voltages from the MRI system's control computer;
    equalizing the gain and nulling the input voltage;
    equally limiting the slew rate of the input voltages to produce tailored input voltages;
    developing a matrix of values which represent attenuation factors defining the axis translation;
    applying the attenuation factors to the tailored input voltages to produce tailored and rotated output voltages;
    applying an equalizing gain and offset to the tailored and rotated output voltages to produce current demand voltages; and
    outputting the current demand voltages to the MRI system's eddy current compensation and gradient current sources yielding imaging planes selectably rotated by one, two or three angles.

* * * * *

UNITED STATES PATENT AND TRADEMARK OFFICE
CERTIFICATE OF CORRECTION

PATENT NO. : 4,933,639
DATED : June 12, 1990
INVENTOR(S) : Barker

It is certified that error appears in the above-identified patent and that said Letters Patent is hereby corrected as shown below:

On the first page, section [54], please replace "AXIS TRANSLATOR" with --AN AXIS TRANSLATOR--.

In column 7, line 26, please replace "overall difference more gain" with --overall difference mode gain--.

Signed and Sealed this

Twenty-fifth Day of June, 1991

Attest:

Attesting Officer

HARRY F. MANBECK, JR.

Commissioner of Patents and Trademarks